(12) United States Patent  (10) Patent No.: US 6,688,906 B2
Kimbley  (45) Date of Patent: Feb. 10, 2004

(54) PROBES AND METHODS FOR TESTING ELECTRICAL CIRCUITS

(75) Inventor: David Nelson Kimbley, Colorado Springs, CO (US)

(73) Assignee: Agilent Technologies Inc., Palo Alto, CA (US)

( * ) Notice: Subject to any disclaimer, the term of this patent is extended or adjusted under 35 U.S.C. 154(b) by 0 days.

(21) Appl. No.: 10/156,297

(22) Filed: May 28, 2002

(65) Prior Publication Data

US 2003/0224641 A1 Dec. 4, 2003

(51) Int. Cl.[7] ............................................. H01R 11/18
(52) U.S. Cl. ....................................... 439/482; 439/289
(58) Field of Search ............................. 439/169, 482, 439/219, 289; 324/72.5, 752

(56) References Cited

U.S. PATENT DOCUMENTS

| | | | |
|---|---|---|---|
| 2,849,681 A | * 8/1958 | Belart | 324/149 |
| 4,636,026 A | 1/1987 | Cooney et al. | |
| 5,367,759 A | 11/1994 | Loew et al. | |
| 5,521,519 A | * 5/1996 | Faure et al. | 324/754 |
| 5,731,710 A | 3/1998 | Mizuno et al. | |
| 5,834,929 A | 11/1998 | Dietz | |
| 5,898,299 A | * 4/1999 | Fodali | 324/149 |
| 5,924,879 A | * 7/1999 | Kameyama | 439/141 |
| 5,942,701 A | 8/1999 | Kamiya | |
| 5,952,843 A | * 9/1999 | Vinh | 324/761 |
| 6,222,377 B1 | 4/2001 | Kato | |
| 6,323,667 B1 | 11/2001 | Kazama | |
| 6,340,320 B1 | 1/2002 | Ogawa | |
| 6,344,751 B1 | 2/2002 | Prokopp et al. | |

* cited by examiner

Primary Examiner—Neil Abrams
Assistant Examiner—Phuong Dinh

(57) ABSTRACT

Probes and methods for testing electrical circuits are provided. One such probe includes a conductive socket, a conductive spring, and a housing that guides the conductive spring to the conductive socket to form an electrical connection between the spring and the socket. Once such method includes providing a conical housing and a spring and guiding the spring to the socket via the conical housing. The guiding step ensures that the spring contacts the socket during assembly and, therefore, ensures that a conductive path from the socket to the spring is provided. Methods and other probes are also provided.

23 Claims, 12 Drawing Sheets

US 6,688,906 B2

PROBES AND METHODS FOR TESTING ELECTRICAL CIRCUITS

FIELD OF THE INVENTION

The present invention relates generally to the field of circuit testing, and particularly to probe assemblies used in the testing of circuitry.

RELATED ART

Probe assemblies are used in the design and manufacture of electrical circuits to test the integrity of signals propagating through the connections of the electrical circuits. Typically, probe assemblies include a conductive contact pin, a probe circuit, and a conductive spring mechanism that connects the contact pin to the probe circuit. The contact pin is typically located at an end of the probe assembly and is pressed in contact with a connection of a circuit under test. A signal propagating along the connection of the circuit under test passes through the contact pin and the spring mechanism to the probe circuit, which tests or measures the signal in accordance with techniques known in the art.

Moreover, as technology has advanced, circuits have decreased in size. To facilitate testing of smaller circuits, the sizes of many probe assemblies have decreased as well. In particular, the contact pin and the spring mechanism for many newer model probe assemblies have significantly decreased in length as compared to older model probe assemblies.

The decreasing size of probe assemblies has precipitated disadvantages in their manufacturing due, in particular, to the small size of the contact pins and spring mechanisms of the probe assemblies. Indeed, ensuring a reliable connection between a small-scale contact pin and a small-scale spring mechanism during an assembly of a circuit probe can be difficult and problematic. When contact is not made between the contact pin and the spring, signals from the circuit under test are unable to pass to the probe circuit, thereby preventing the circuit probe from operating properly.

SUMMARY OF THE INVENTION

Generally, the present invention provides probes for testing a circuit. A probe in accordance with an exemplary embodiment of the present invention includes a conductive socket adapted to receive a contact pin and a conductive spring. In addition, the probe includes a housing shaped for guiding the spring to the socket to form an electrical connection between the spring and the socket.

The present invention can also be viewed as providing methods for testing circuitry. One such method can be broadly conceptualized by the following steps: providing a conical housing that includes a conductive socket; providing a spring; and guiding the spring to the socket via the conical housing.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The elements of the drawings are not necessarily to scale relative to each other, emphasis instead being placed upon clearly illustrating the principles of the invention. Furthermore, like reference numerals designate corresponding parts throughout the figures.

DETAILED DESCRIPTION OF THE INVENTION

Figure 1:
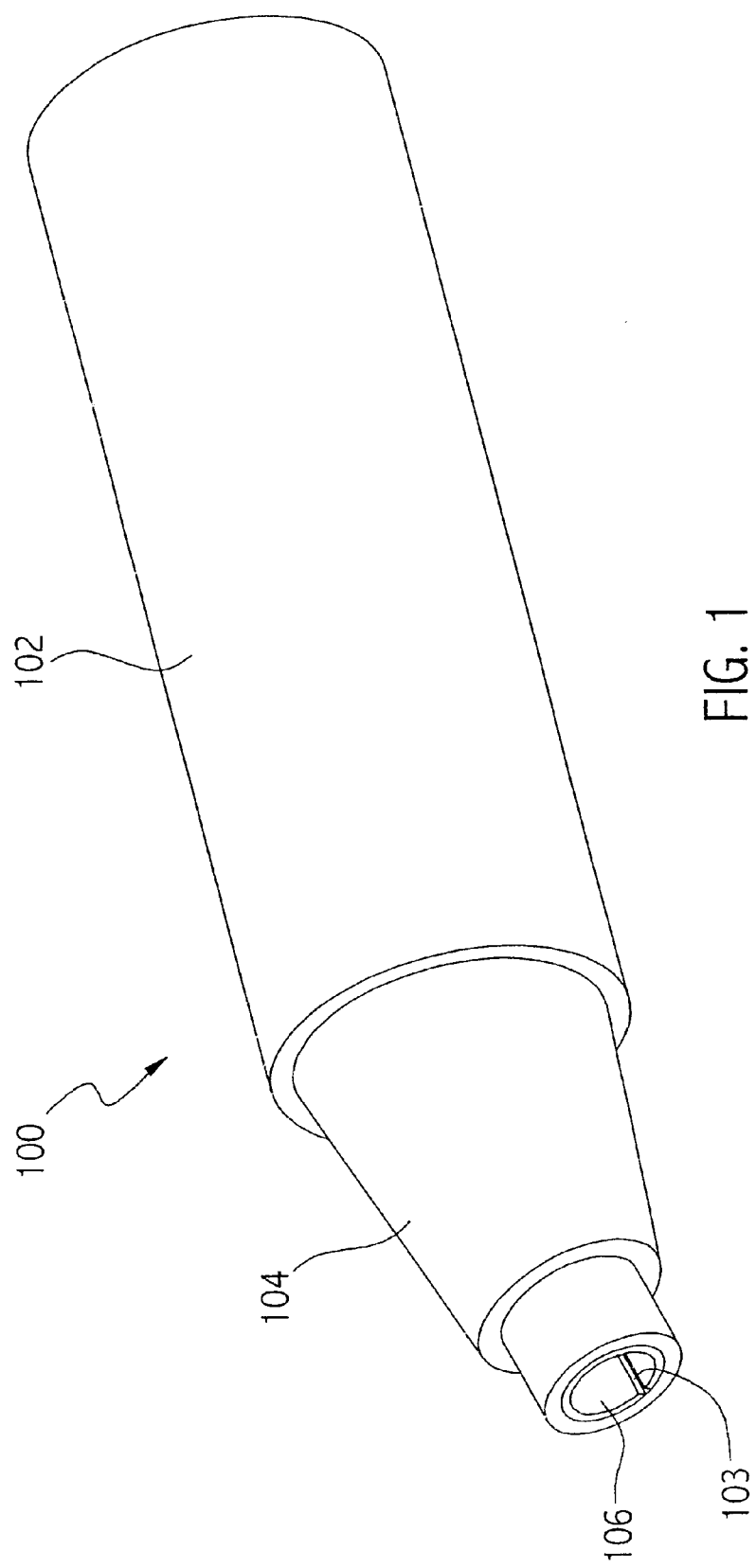
FIG. 1 is an isometric drawing of the probe assembly in accordance with an exemplary embodiment of the present invention.

In general, the present invention involves probe assemblies for testing electrical circuits. FIG. 1 generally depicts a probe assembly 100 in accordance with an embodiment of the present invention.

The probe assembly 100 includes a conical nose 104 rigidly attached at its base to a cylindrical barrel 102. At an opposing end, the conical nose 104 includes a socket 106. The socket 106 shown in FIG. 1 is a cylindrically shaped female that receives a conductive contact pin, which will be described in further detail below. Note that the barrel 102 and the socket 106 are fabricated out of a gold plated conductive metal, although other types of materials may be employed in other embodiments. In addition, the socket 106 includes a slit 103 in the cylindrical wall of the socket 106 that allows for crimping the socket 106 to secure objects placed within the socket 106.

Figure 2:
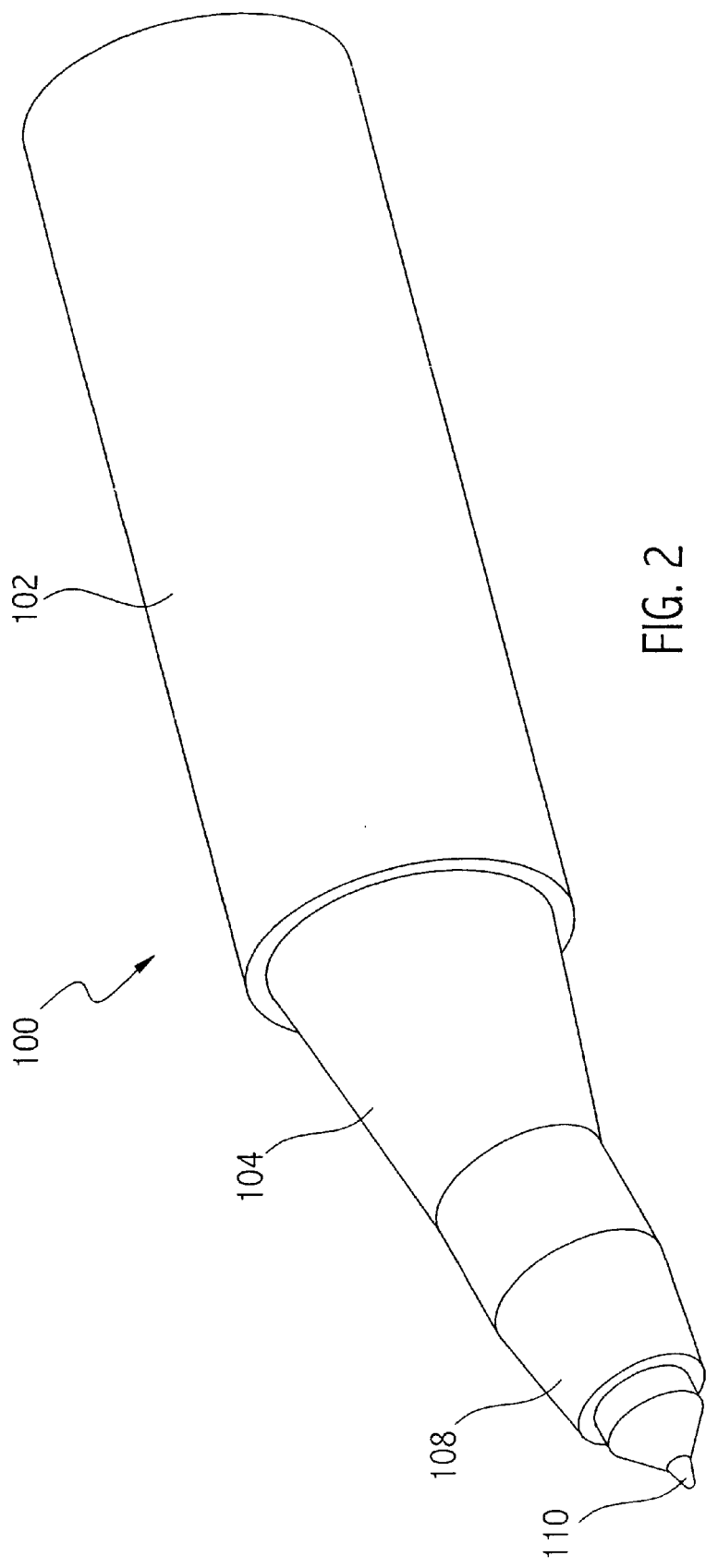
FIG. 2 is an isometric drawing of the probe assembly of FIG. 1 attached to a resistor pin.

FIG. 2 illustrates the probe assembly 100 when a conductive contact pin assembly 108 is attached to the socket 106 (FIG. 1) of the probe assembly 100. Note that conductive contact pin 108 includes a resistor pin, although other types of pins can be used. The contact pin assembly 108 attaches to the probe assembly 100 creating a conductive path from the contact point 110 to the socket 106 (FIG. 1).

Figure 3:
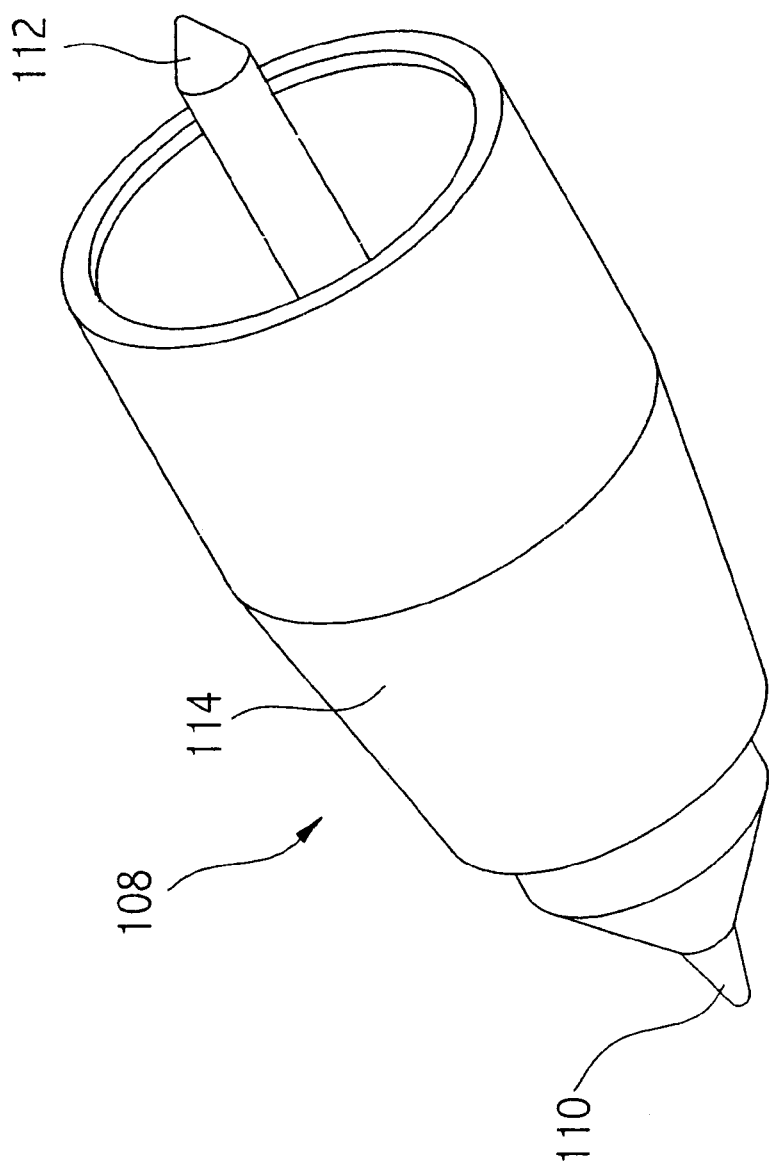
FIG. 3 is an isometric drawing of the resistor pin depicted in FIG. 2.

A more detailed view of the conductive contact pin assembly 108 is depicted in FIG. 3. In this regard, conductive contact pin assembly 108 includes a hollow conical component 114. Protruding from within the hollow housing of the conical component 114 is a pin tail 112. The pin tail 112 is sized and shaped to fit within the socket 106 (FIG. 1) of the probe assembly 100.

Figure 4:
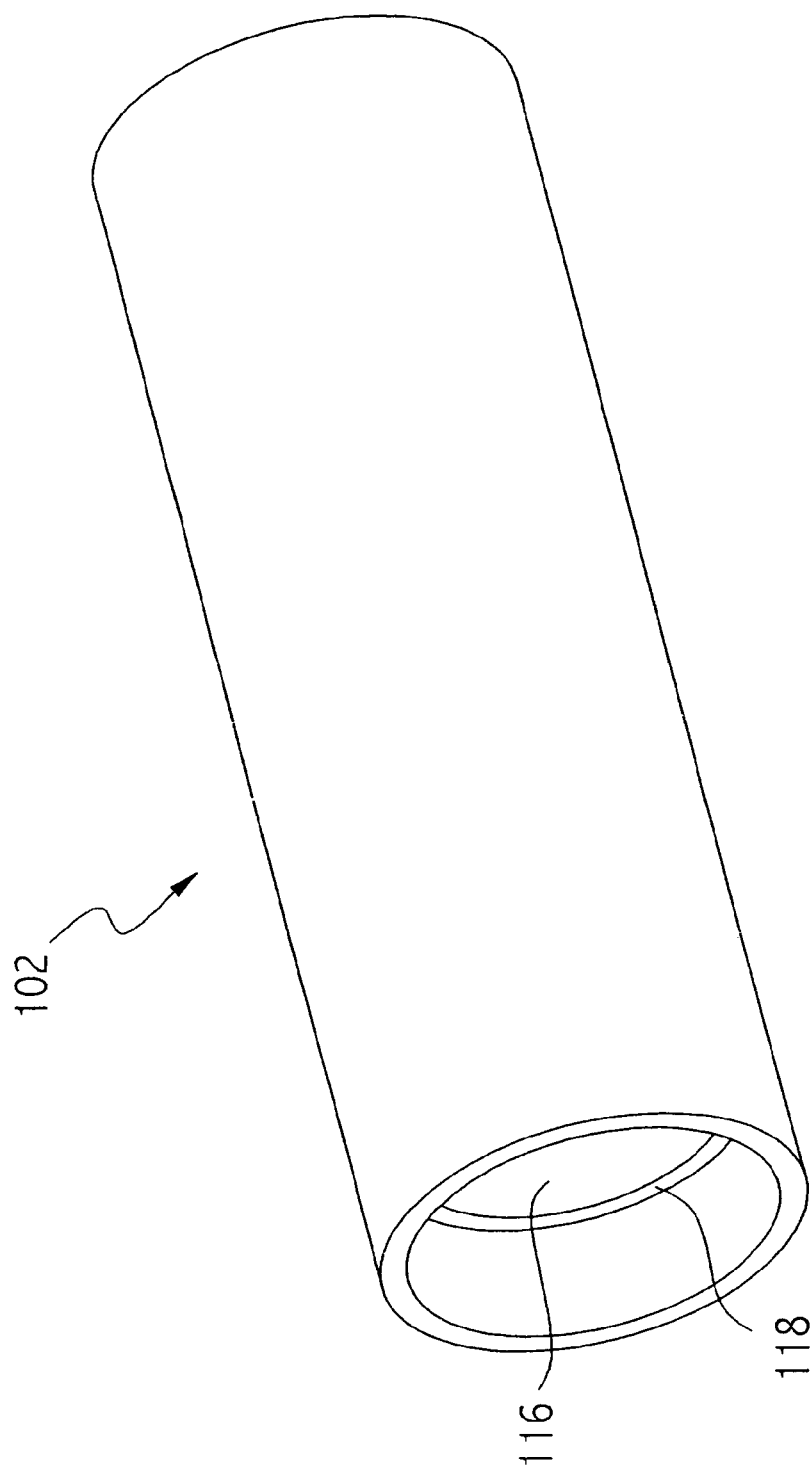
FIG. 4 is an isometric drawing of the barrel of a probe assembly depicted in FIG. 1.

FIG. 4 depicts a more detailed view of the barrel 102 of the probe assembly 100 illustrated in FIG. 1. The barrel 102 is a hollow cylinder that receives the base of the conical nose 104 (FIG. 1). As shown by FIG. 4, within the conical nose-receiving end 116 of the barrel 102, a ledge 118 provides a stop, which allows the barrel 102 to properly retain the base of the conical nose 104 (FIG. 1). The retaining nature of the ledge 118 is discussed in more detail later with reference to FIG. 5 and FIG. 6.

Figure 5:
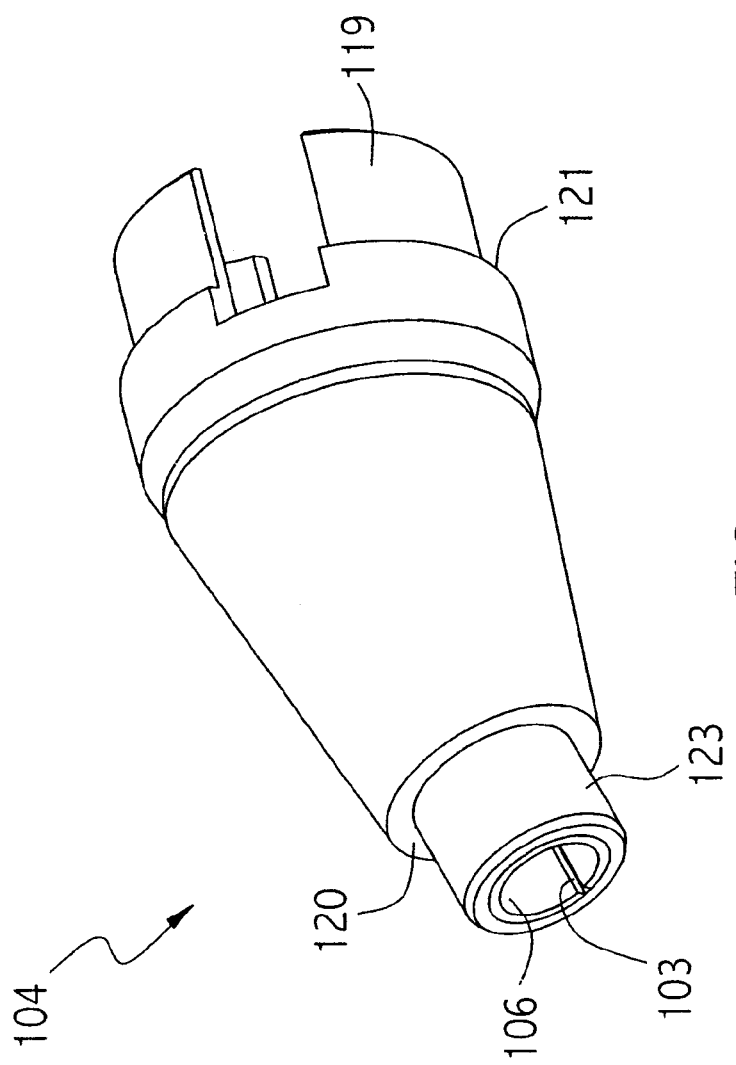
FIG. 5 is an isometric drawing of the conical nose of the probe assembly depicted in FIG. 1.

In this regard, FIG. 5 depicts a more detailed view of the conical nose 104 of the probe assembly 100 that is depicted in FIG. 1. The conical nose 104 includes, at its vertex, a resistor pin tail-receiving cylinder 123. The nose 104 is sized and shaped to be inserted into a hollow contact pin assembly body 114 of the resistor pin 108 depicted in FIG. 3. When this occurs, the pin tail 112 (FIG. 3) of the resistor pin 108 passes through the socket 106 (FIG. 5). The conductive contact pin assembly 108 and the conical nose 104 are pushed together until the pin tail 112 engages and is stopped by the ledge 120 of the conical housing 104.

In addition, the conical nose 104 (FIG. 5) includes an insertion tail 119 that fits within the receiving end 116 (FIG. 4) of the barrel 102. The ledge 118 within the barrel opening 116 provides a stop preventing the nose 104 from proceeding past the ledge 118 upon insertion of the conical nose 104 into the barrel opening 116. In addition, the ledge 121 of the conical nose 104 rests upon the lip of the barrel opening 116 further retaining the conical nose 104.

Figure 6:
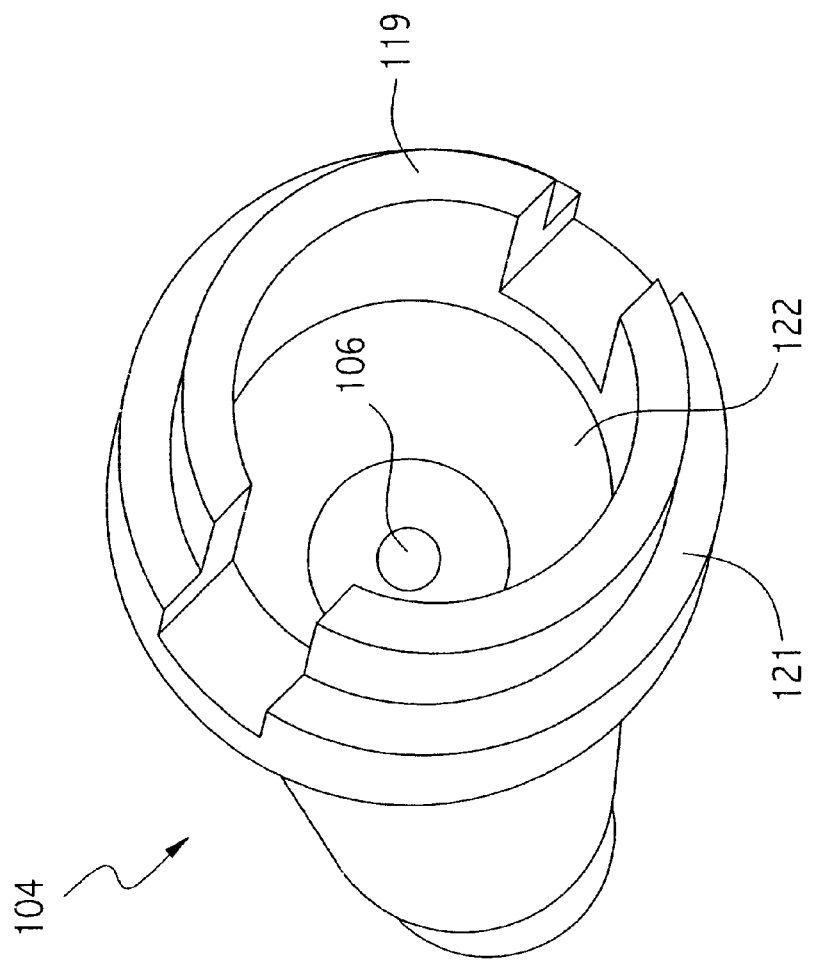
FIG. 6 is an isometric drawing of the conical nose depicted in FIG. 5 illustrating a view of the inner walls of the nose.

FIG. 6 shows an isometric view from the perspective of the hollow base of the conical nose 104. As shown by FIG. 6, an inner wall 122 of the conical housing 104 converges to a circular conductive contact, which is the socket 106 (FIG. 5) inserted within the conical housing 104. Note that convergence of the inner wall 122 terminates at the rear of the socket 106. As noted herein, the socket 106 is fabricated from a conductive material, for example a gold-plated metal. Therefore, the inner portion at the socket end of the conical housing 104 is conductive. More specifically, the inner portion of the cylinder 123 (FIG. 5) is conductive. Further note that in some embodiments the converging inner wall 122 could be smooth.

Figure 7:
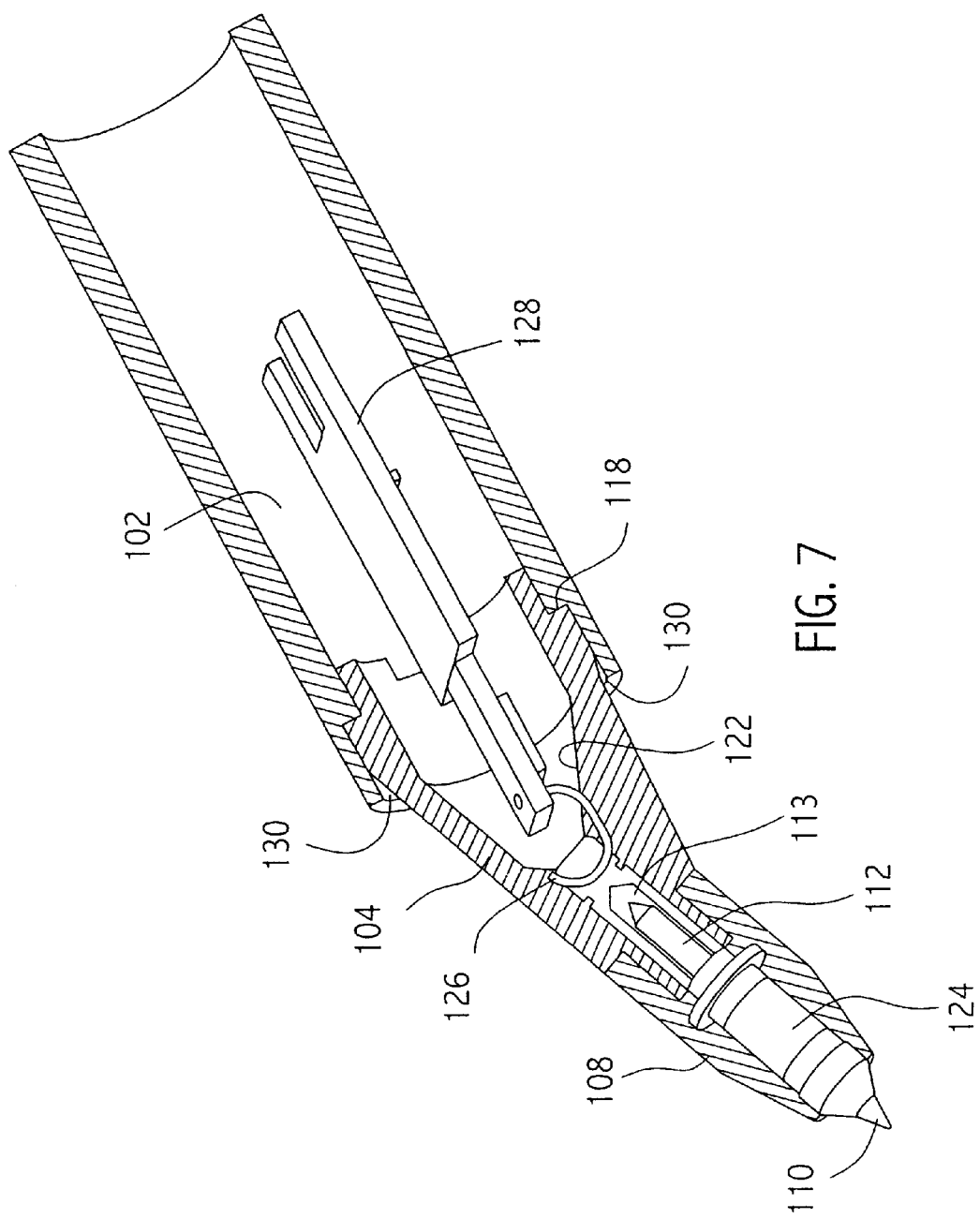
FIG. 7 is a cross-sectional view of the probe assembly depicted in FIG. 1.

FIG. 7 illustrates a cross-sectional view of the probe assembly 100 when a conductive contact pin assembly 108 (FIG. 3), the conical nose 104 (FIG. 5), and the barrel 102 (FIG. 4) are interconnected. As shown by FIG. 7, a printed circuit board (PCB) 128 is affixed to the barrel 102, and a spring 126 is attached at an end of the PCB 128 that is inserted into the conical nose 104. Therefore, when the conical nose 104 is attached to the barrel 102, as shown by FIG. 7, the spring 126 abuts the socket 106. This assembly of the components effectuates a conductive path through which a signal can travel from the tip 110 of the conductive contact pin assembly 108 to the PCB 128 via the socket 106 and the spring 126.

In this regard, the pin tail 112 of the pin assembly 108 is conductively coupled to the contact point 110 through a resistor 124. Furthermore, the pin tail 112 fits within a cavity 113 of the socket 106 and is electrically coupled to the socket 106. In addition, the socket 106 extends along the length of the cylinder 123 (FIG. 5) of the conical nose 104, and the spring 126 abuts and is deflected by the socket 106, thereby forming an electrical connection between the spring 126 and the socket 106. The spring 126 is attached to a PCB 128 that connects at its opposing end to a coaxial cable (not shown) which in turn is connected to a probe circuit, (not shown).

With reference to FIG. 7, causing the conductive contact pin 110 to come in contact with an electrical connection of the circuit tests a circuit (not shown). A signal propagating along this connection travels through the conductive pin tail 112 to the conductive socket 106, and in turn is conducted by the spring 126 to the PCB 128. The signal is then routed to a probe circuit (not shown) through a coaxial cable (not shown). Note that various tests of the circuit under test can be performed based on the signal. Also note that the signal can be routed from the PCB to a probe circuit for testing by connectors, other than a coaxial cable in other embodiments.

As shown by FIG. 7, the spring 126 may have a small diameter and may be shaped such that the conductance path through the spring is short in length, which results in an advantageous characteristic of the circuit testing assembly 111. Such a fabrication and shape of the spring result in a shortened conductive path that inherently exhibits low capacitance and inductance characteristics. Therefore, the speed with which signals can traverse the conductive path increases, and the bandwidth capability of the probe as a whole increases.

Moreover, in the embodiment depicted, the spring 126 is formed from a small diameter wire and can be rounded on its inserting end to better enable unobstructed insertion into the conical nose 104 (FIG. 1). More specifically, the portion of the spring that comes into contact with the inner wall 122 of the conical nose 104 is rounded or blunt. Making this portion of the spring 126 rounded or blunt helps the spring 126 to travel through the conical housing without engaging the inner wall 122 and becoming snared on the wall thereby preventing contact of the spring 126 with the socket 106. Note that the spring 126 is made of a metal exhibiting spring qualities, for example berillium copper or music wire. However, the spring 126 shape and material are not limited, and the connection between the socket 106 and the PCB 128 can be effectuated by a spring formed into an alternative shape and/or by a spring having an alternative elemental make-up.

In addition, the PCB 128 provides a circuit that propagates a signal from the spring 126 to a coaxial cable (not shown) attached at the PCB's 128 opposing end. A PCB of an embodiment is described in more detail with reference to FIG. 8. However, it should be noted that any circuit that propagates the signal from the spring 126 to a connector that transmits the signal to a probe circuit could be used.

Figure 8:
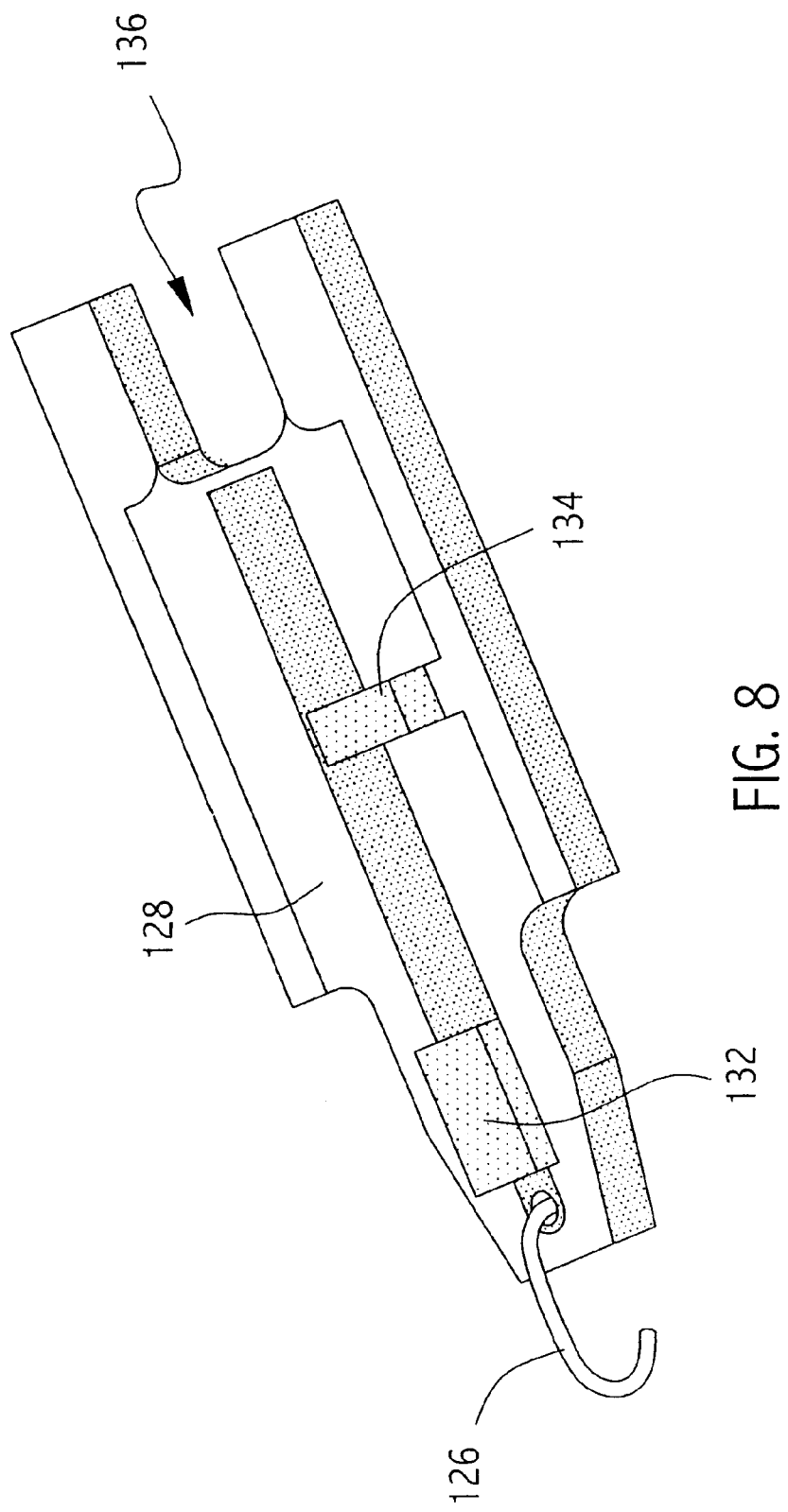
FIG. 8 is an isometric drawing of the printed circuit board and spring depicted in FIG. 7.

As shown in an embodiment of FIG. 8, the spring 126 is connected to the PCB 128 at one end. At an opposing end of the PCB 128 is a u-shaped receptacle 136 for receiving a coaxial cable. Note that the ground of the coaxial cable can be soldered to the legs of the u-shaped receptacle, and the center conductor of the coaxial cable can be soldered to the center conductive portion of the PCB 128. The signal propagates through a capacitor 132 and then a resistor 134, which is connected to ground. The conductor of the coaxial cable (not shown) then receives the signal.

An exemplary process for manufacturing the assembly 111 will now be described in more detail. Initially, the barrel 102, including the spring 126, is attached to the conical nose 104 such that the spring 126 is positioned abutting the socket 106. The process of assembling the barrel 102 and the conical nose 104 is now described in more detail with reference to FIG. 9A, FIG. 9B, and FIG. 9C. When viewed consecutively, the figures show the positioning of the spring 126 as the barrel 102 is attached to the conical nose 104.

Figure 9A:
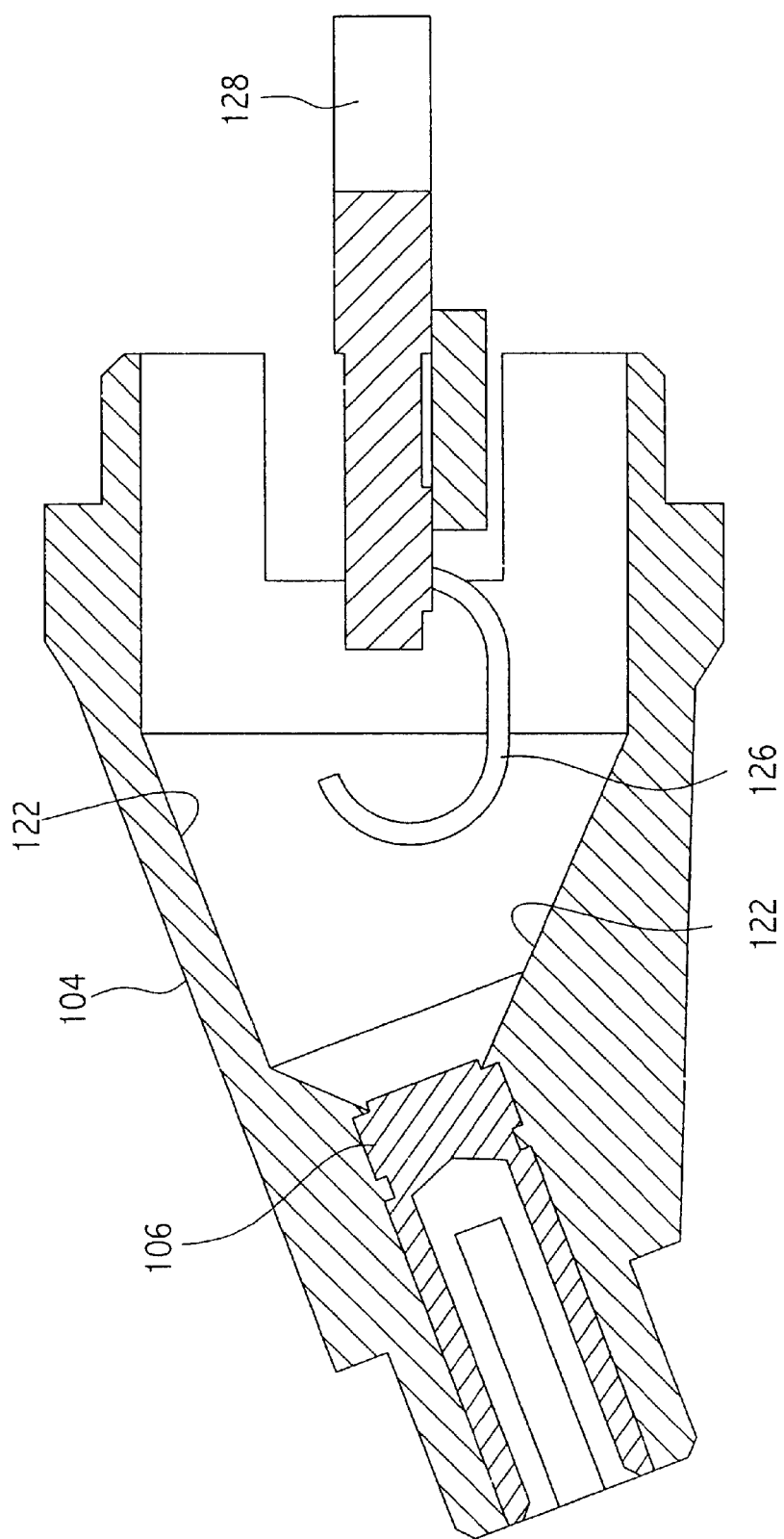
FIGS. 9A–9C are consecutive elevation views of insertion of the spring and printed circuit board of FIG. 7 into the conical nose depicted in FIG. 1.

FIG. 9A shows the spring 126 in an initial position as the barrel is moved toward the base of the conical nose 104. The spring 126 is within the center of the base of the conical nose 104. Therefore the spring's position relative to the conical wall 122 is such that the spring 126 does not contact the conical wall 122. However, due to misalignments during manufacturing, the spring 126, in many instances, will actually contact the wall 122 and slide down the surface of the wall 122 toward the socket 106 as the barrel 102 and the nose 104 are pressed together.

Figure 9B:
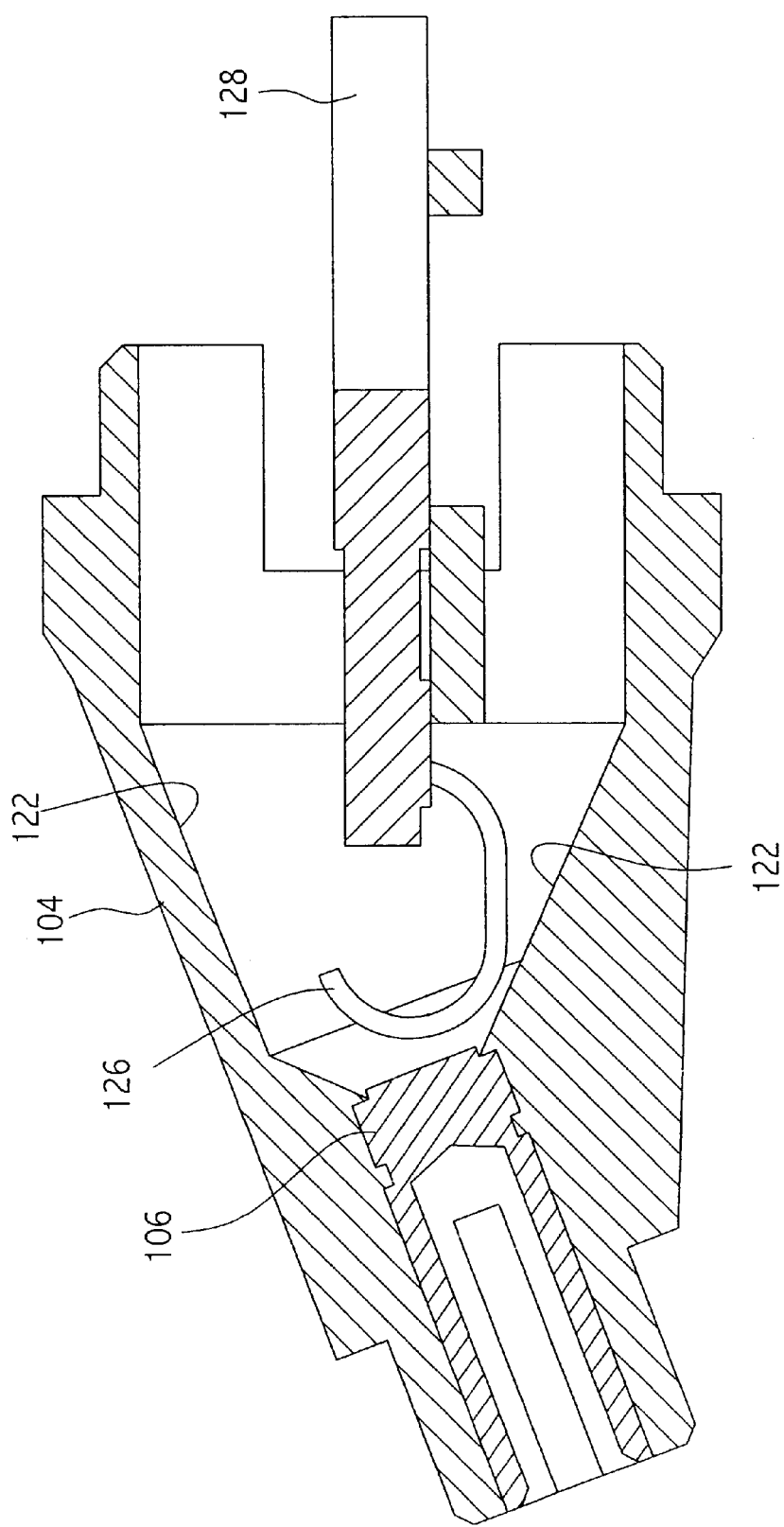
Figure 9C:
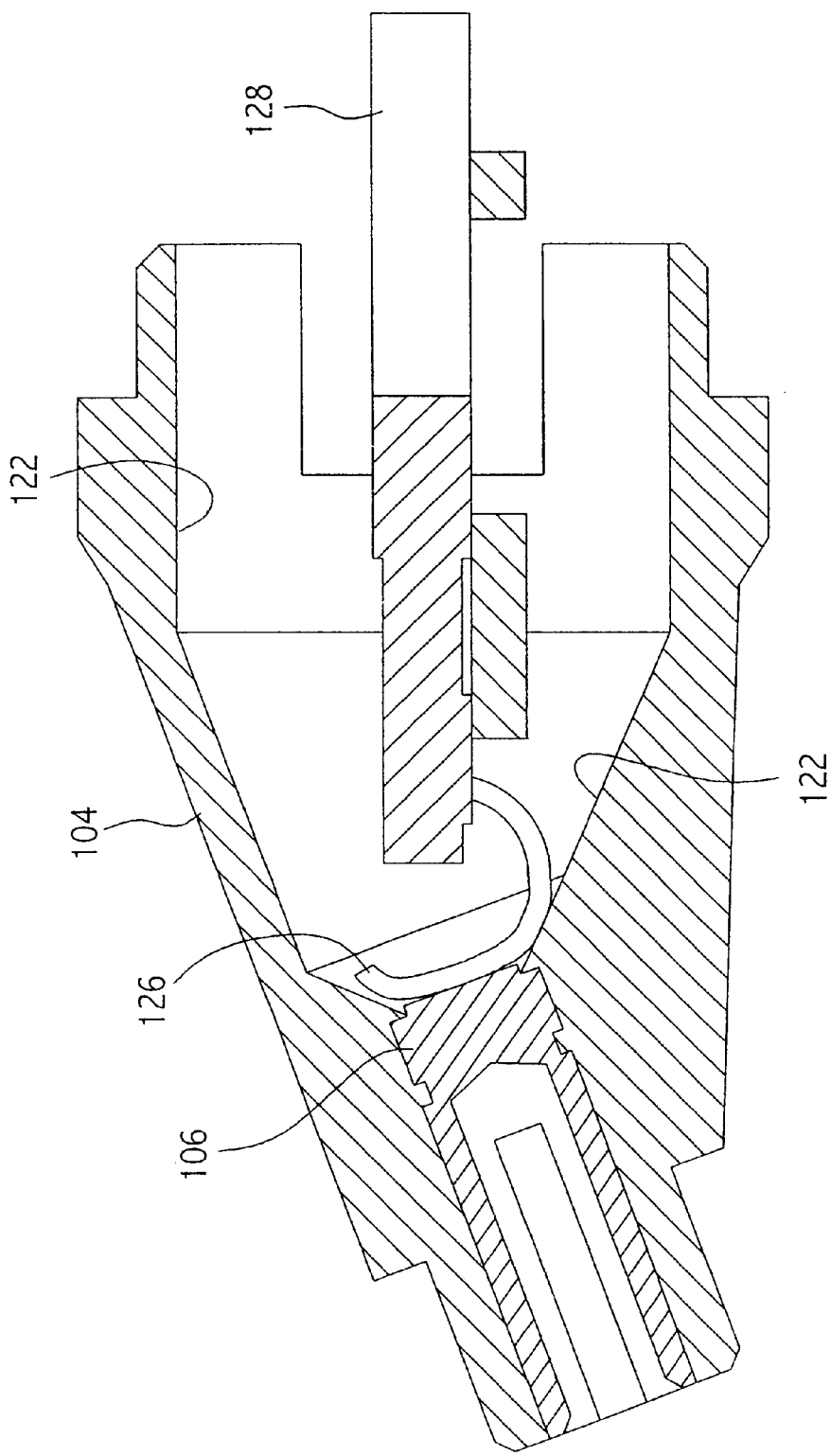

FIG. 9B shows the spring 126 in an intermediate position as the spring is further pushed within the conical housing 104 toward the socket end of the housing 104 during assembly of the circuit test assembly 111 (FIG. 7). As the spring 126 moves toward the socket 106, the conical wall 122 of the housing 104 guides the spring 126, if the spring 126 comes into contact with the wall 122 of the housing 104. In this regard, the conical wall 122 tapers or converges toward the socket end of the housing, and when the spring 126 encounters the conical wall 122 of the housing 104 as the circuit tester 111 is being assembled, the wall 122 guides the spring in the direction of the socket 106. FIG. 9C shows the final placement of the spring 126 abutting the socket 106.

It should be noted that the configuration of the housing 104 and the spring 126 are such that the likelihood of the spring getting hung on a portion of the housing 104 is reduced. In this regard, the rounded characteristics of the spring 126 help to prevent the spring 126 from catching on the conical surface of the housing 104. Furthermore, the rounded nature of the spring 126 helps to point the tip of the spring 126 away from the surface of the wall 122 such that the tip does not contact the wall 122. This helps to ensure that the spring tip does not engage the wall 122 and prevent the spring from reaching the socket 106. This effect is further enhanced by the uniform or continuous nature of the wall 122. In this regard, as can be seen by viewing FIGS. 9A–9C, the portion of the wall 122 that guides the spring 126 has no edges or corners that can catch or engage the spring 126 as the spring 126 slides down this continuous portion of the wall surface. Moreover, the converging inner wall 122 and the rounded nature of the spring 126 work in conjunction to ensure that the spring 126 can slide down the surface of the wall 122 and contact the socket 106 creating an electrical path from the socket 106 through the spring 126.

Figure 10:
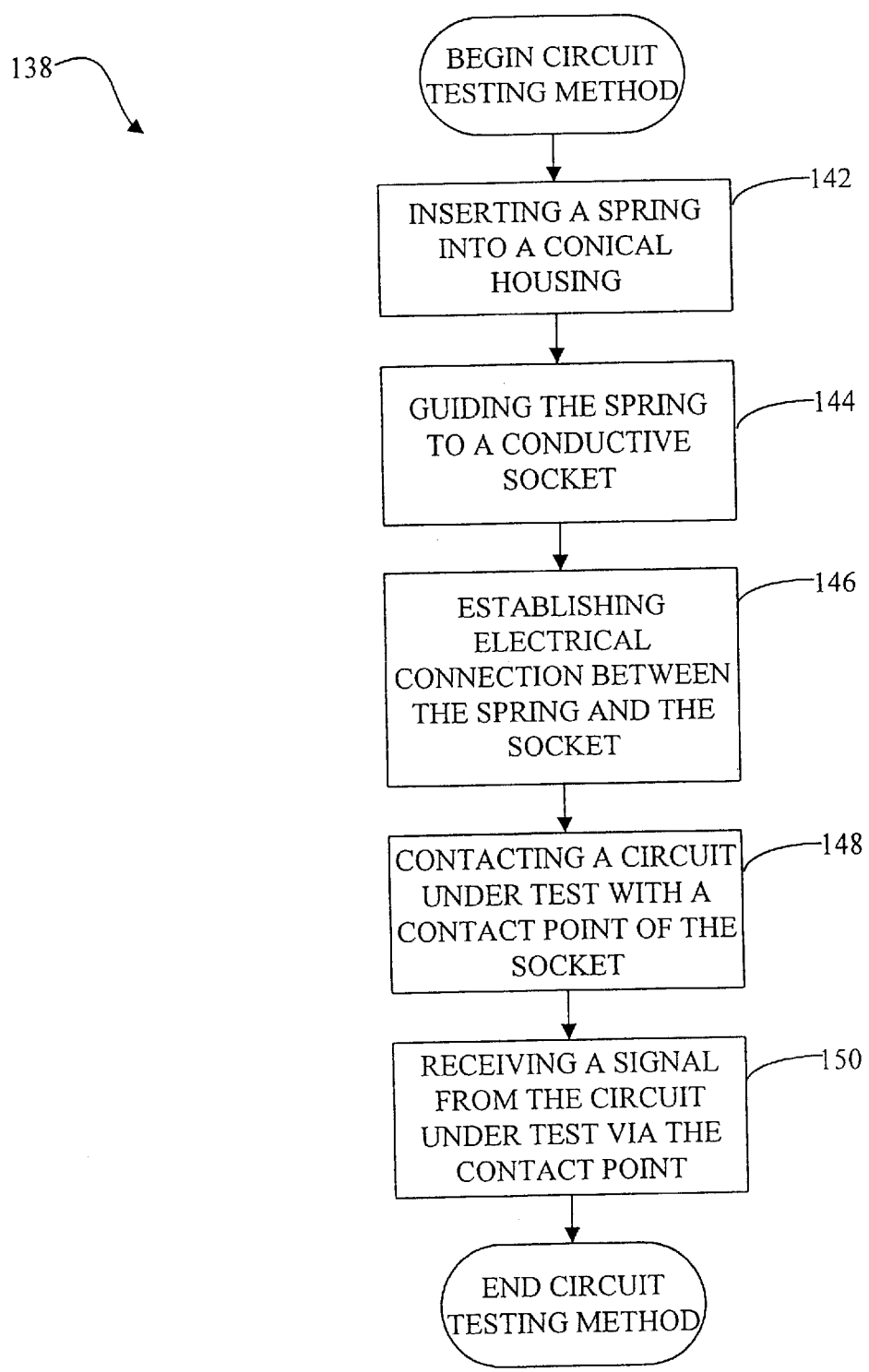
FIG. 10 is a flowchart illustrating a circuit testing method as depicted in FIGS. 9A–9C.

Reference will now be made to the flowchart of FIG. 10, which depicts the functionality of an embodiment of a probe assembly 100. It should be noted that, in some alternative implementations, the functions noted in various blocks of FIG. 10 may occur in an alternative order from which they are depicted in FIG. 10. For example, the respective function of two blocks shown in succession in FIG. 10 may, in fact, be performed substantially concurrently. In other embodiments, the respective functions may be performed in the reverse order.

As shown in FIG. 10, the circuit testing method 138 can be said to begin at block 142 by inserting a spring 126 into a conical housing. The conical housing has a tapering inner wall that converges to a conductive socket. In this regard, the next block 144 indicates a next step of guiding the conductive spring 126 to the conductive socket 106. As the spring 126 is guided to the conductive socket 106, the next block indicates the step of establishing an electrical connection between the spring 126 and the conductive socket. This is accomplished by pressing the spring 126 against the conductive socket 106. The next step in the circuit testing method includes contacting a circuit under test with a contact point 110. This contact point 110 is electrically coupled to a contact pin 112 that is, in turn, electrically coupled to the socket 106. In this regard, a signal present in the circuit under test is conducted to the socket 106. Thus, block 150 indicates the step of receiving a signal from the circuit under test via the conductive path established between the contact point 110 and the test circuit electrically coupled to the spring 126.

It should be emphasized that the above-described embodiments of the present invention are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

What is claimed is:

1. A probe for testing a circuit, said probe comprising:
   a conductive socket;
   a spring having a rounded portion electrically coupled to the conductive socket; and
   a conical housing coupled to the conductive socket, the conical housing having a tapering inner wall for guiding the spring to the socket.

2. The probe as claimed in claim 1 wherein the tapering inner wall comprises a continuous surface for preventing the spring from hanging on the tapering inner wall.

3. The probe as claimed in claim 2 wherein the tapering inner wall converges to the conductive socket.

4. The probe as claimed in claim 3 further comprising a testing circuit, wherein the spring is attached to the testing circuit establishing an electrical path from the conductive socket to the testing circuit.

5. A probe for testing a circuit, said probe comprising:
   a conductive socket;
   a conductive spring that contacts the conductive socket establishing an electrical path from the conductive socket to the conductive spring; and
   a conical housing having a uniformly tapering inner wall for guiding the conductive spring to the conductive socket.

6. The probe for testing a circuit as claimed in claim 5 wherein the tapering inner wall converges to the conductive socket.

7. The probe for testing a circuit as claimed in claim 6 wherein the conductive spring has a rounded portion at an insertion end of the spring.

8. The probe for testing a circuit as claimed in claim 7 wherein the tapering inner wall comprises a continuous surface for preventing the rounded portion at the insertion end of the spring from hanging on the inner wall.

9. The probe for testing a circuit as claimed in claim 8 further comprising a contact pin electrically coupled to the socket, wherein an electrical signal detected by the contact pin is conducted to a testing circuit electrically coupled to the conductive spring.

10. A probe for testing a circuit, said probe comprising:
    a conductive socket adapted to receive a contact pin;
    a conductive spring; and
    means for guiding the spring to the socket to form an electrical connection between the spring and the socket.

11. The probe as claimed in claim 10 wherein the means for guiding the spring comprises a conical housing having a tapered inner wall.

12. The probe as claimed in claim 11 wherein the tapered inner wall includes a uniform surface converging to the conductive socket.

13. The probe as claimed in claim 12 wherein the spring has a blunt insertion end for preventing the spring from hanging on the inner wall of the conical housing.

14. The probe as claimed in claim 13 wherein the blunt insertion end of the spring comprises a rounded wire.

15. The probe as claimed in claim 14 further comprising:
a conductive pin attached to the conductive socket; and
a probe circuit attached to the conductive spring, wherein a conductive path extends from the contact pin to the probe circuit.

16. The probe as claimed in claim 15 wherein the spring comprises a wire, the wire adapted such that a rounded portion of the wire contacts the guiding means as the spring is being passed through the guiding means.

17. A method for testing a circuit, said method comprising:
providing a conical housing, the housing having a conductive socket;
providing a spring; and
guiding the spring to the socket via the conical housing.

18. The method for testing a circuit as claimed in claim 17 further comprising electrically coupling the spring to the socket.

19. The method for testing a circuit as claimed in claim 18 wherein the electrically coupling step comprises:
inserting the spring into the conical probe housing having an inner wall that converges to the conductive socket; and
pressing the spring against the conductive socket thereby establishing an electrical path from the socket to the spring.

20. The method for testing a circuit as claimed in claim 19 wherein the guiding step comprises:
contacting the rounded portion of the spring with the inner wall; and
pushing the rounded portion along a surface of the inner wall.

21. A probe for testing a circuit, comprising:
a conductive socket adapted to receive a contact pin;
a conductive spring; and
a probe body contiguous with the conductive socket, the probe body comprising a tapered inner wall for guiding the spring to the socket.

22. The probe of claim 21, wherein the probe body comprises a barrel portion contiguous with a conical portion, the socket configured to attach to the conical portion of the probe body.

23. A probe for testing a circuit, comprising:
a conductive socket adapted to receive a contact pin;
a conductive spring; and
a probe body contiguous with the socket, the probe body configured such that the conductive spring contacts an inner wall of the probe body as the spring is inserted, thereby guiding the spring to the socket.

* * * * *